United States Patent [19]
Galluzzi et al.

[11] Patent Number: 5,107,174
[45] Date of Patent: Apr. 21, 1992

[54] THIN-FILM ELECTROLUMINESCENT DEVICE

[75] Inventors: Fabrizio Galluzzi, Rome; Nicola Romeo; Vittorio Canevari, both of Parma; Giorgio Sberueglieri, Cavriago, all of Italy

[73] Assignees: Eniricerche, S.p.A.; Enichem, S.p.A., Milan, Italy

[21] Appl. No.: 477,119

[22] Filed: Feb. 7, 1990

Related U.S. Application Data

[63] Continuation of Ser. No. 211,480, Jun. 24, 1988, abandoned.

[30] Foreign Application Priority Data

Jul. 1, 1987 [IT] Italy .................. 21141 A/87

[51] Int. Cl.$^5$ ............... H05B 33/26; H05B 33/14
[52] U.S. Cl. ..................... 313/503; 313/509
[58] Field of Search ................. 313/503, 509

[56] References Cited

U.S. PATENT DOCUMENTS

| | | | |
|---|---|---|---|
| 3,329,850 | 7/1967 | Motson | 313/503 |
| 4,373,145 | 2/1983 | McCarthy et al. | 313/503 |
| 4,647,813 | 3/1987 | Kitabayashi et al. | 313/503 X |
| 4,668,582 | 5/1987 | Matsuoka et al. | 313/503 X |
| 4,670,355 | 6/1987 | Matsudaira | 313/503 X |
| 4,672,266 | 6/1987 | Taniguchi et al. | 313/509 |
| 4,733,128 | 3/1988 | Tohda et al. | 313/503 |
| 4,737,684 | 4/1988 | Seto et al. | 313/503 |
| 4,757,235 | 7/1988 | Nunomura et al. | 313/509 |
| 4,794,302 | 12/1988 | Nire et al. | 313/509 |

Primary Examiner—Palmer C. DeMeo
Attorney, Agent, or Firm—Shea & Gould

[57] ABSTRACT

This relates to a thin film, multilayered device with a threshold voltage for electroluminescence less than 100v having good electro-optical characteristics. The layers comprise an amorphous support, on which a binary alloy layer, a luminescent layer, an insulating layer, and a conductor layer are deposited.

9 Claims, 1 Drawing Sheet

THIN-FILM ELECTROLUMINESCENT DEVICE

This application is a continuation of application Ser. No. 211,480, filed June 24, 1988, and now abandoned.

FIELD OF THE INVENTION

The present invention relates to a thin-film electroluminescent device, which can be obtained by preparing thin-film crystalline metals or semiconductors on amorphous substrates.

BACKGROUND OF THE INVENTION

In the art thin-layer electroluminescent devices are known which are actuated alternating current (AC-TFEL: alternating current-thin film electroluminescence), used in variable-information displays and in image displays.

For example, L. E. Tannas, in "Flat Panel Displays and CRT's", Van Nostrand-Reinhold, New York, 1985, page 237, describes the use of AC-TFEL devices in flat displays.

The AC-TFEL devices known from the prior art are generally provided with a structure formed by a glass support, on which there are deposited, in succession: a metal layer, an insulating layer, a luminescent layer, an insulating layer, and a transparent conductive layer.

In particular, the metal layer can be formed by aluminum or gold; the insulating layers can be formed by yttrium oxide ($Y_2O_3$), aluminum oxide ($Al_2O_3$), barium titanate ($BaTiO_3$), silicon nitride ($Si_3N_4$), or their mixtures; the luminescent layer can be formed by zinc sulphide (ZnS) and zinc selenide (ZnSe), with luminescent impurities of manganese; and the transparent conductive layer can be formed by indium oxide ($In_2O_3$), tin oxide ($SnO_2$) or relevant mixtures, e.g., a mixture containing indium oxide and tin oxide in mutual proportions of the order of 9:1 by weight.

As reported by D. Theis et al., in J. Crystal Growth 63, 47 (1983) and by D. Theis, in Physica Status Solidi (a) 81, 647 (1984), the electro-optical characteristics of the thin-film electroluminescent devices mainly depend on the microstructure of the luminescent layer.

More particularly, the luminescent layers prepared by means of the usual flash evaporation technique and sputtering technique, typically show a microcrystalline structure, with grains having side dimensions smaller than 0.050–1.0 $\mu m$, for thicknesses of up to approximately 0.2 $\mu m$. When the thickness reaches the value of approximately 0.5 $\mu m$, the side dimension of the grains increases up to approximately 0.3–0.5 $\mu m$. With such a microstructure of the luminescent layer, peak voltages generally higher than 150 V are required in order to induce electroluminescence in the relevant electroluminescent device.

Furthermore, by using the deposition method known as "Atomic Layer Epitaxy", described, by T. Suntola and J. Hyvarien, in Annual Review of Material Science, 15, 177 (1985), preparing luminescent layers of multicrystal zinc sulphide doped with manganese, good-quality columnar grains, is possible. These grains have side dimensions larger than 0.1 $\mu m$ and smaller than 1 $\mu m$, which remain constant with varying thickness, at least for thicknesses higher than 0.05 $\mu m$. With such a microstructure of the luminescent layer, peak voltages lower than a150 V, but higher than 100 V are necessary in order to induce electroluminescence in the relevant electroluminescent device.

In order to further improve the microstructure of the luminescent layer, and therefore the performance of the electroluminescent devices which incorporate such a layer, structures have been proposed in the art, which are based on semiconductor supports, mostly obtained by means of complex and expensive deposition methods. For example, K. Hirabayashi and K. Katoh, in the Japanese Journal of Applied Physics, 24, L 629 (1985), describe a structure formed by single-crystal silicon; single-crystal zinc sulphide doped with manganese; insulating layer; and transparent conductive layer; in which the deposition of the active layer of zinc sulphide is carried out by means of molecular beams and wherein the single-crystal structure of the layer is obtained by epitaxy on single-crystal silicon (Molecular Beam Epitaxy). By means of such a device, the peak voltages, suitable for inducing electroluminescence, can be lower than 100 V.

On the basis of such a present state of the prior art, the purpose of the present invention is an electroluminescent device having good electro-optical characteristics, and a low threshold voltage for electroluminescence, which can be obtained by means of the usual flash evaporation technique or sputtering technique.

SUMMARY OF THE INVENTION

The present Applicant has found, according to the present invention, that on an amorphous support and by means of the usual depositions techniques a multicrystal layer can be formed, of a binary alloy which can include two different metals, capable of forming a homogeneous solid solution.

The present Applicant has also found that a multicrystal electroluminescent layer can be deposited on such a binary alloy layer by means of the usual deposition techniques, and can be made grow by epitaxial or quasirheotaxial growth.

The present Applicant observed finally that an electroluminescent device, which incorporates said binary alloy layer and said luminescent layer, displays good electrooptical characteristics, and is capable of emitting luminescence with threshold voltages generally lower than 100 V.

In accordance therewith, according to a first aspect, the present invention relates to a thin-film electroluminescent device, endowed with good electrooptical characteristics, with a threshold voltage for electroluminescence generally lower than 100 V, with said device comprising:

(a) an amorphous support;
on which there are deposited, in succession:
(b) a binary alloy layer;
(c) a luminescent layer;
(d) an insulating layer; and
(e) a conductive layer;
  with said (b) binary alloy layer being alloy which can include two different metals having mutually different melting points and capable of forming a homogeneous solid solution, and having a multicrystal structure, with columnar (tabular) grains with average side dimensions equal to, or larger than, 1 $\mu m$, up to 500 $\mu m$, and with a thickness equal to, or higher than, 0.2 $\mu m$; and
  said (c) luminescent layer being a zinc sulphide or zinc selenide layer, doped with manganese, and having a multicrystal structure, with columnar (tabular) grains with average side dimensions equal to, or larger than, 1 μm, up to 500 μm, and a thickness equal to, or lower than, 2 μm.

According to the preferred embodiment, the grains of the (b) binary alloy layer have side dimensions comprised within the range of from 10 to 100 μm, and thicknesses comprised within the range of from 0.5 to 2 μm. Furthermore, the components of the binary alloy capable of forming solid solutions, are selected from lead, tin, bismuth, antimony, aluminum, gallium, silicon, silver, indium and gold.

The use of the binary alloy couples aluminum/silicon, lead/tin, aluminum/germanium, aluminum/gallium or bismuth/tin is preferred.

Still in the preferred form of practical embodiment, the grains of the (c) luminescent layer show average side dimensions comprised within the range of from 5 to 50 μm, and thicknesses comprised within the range of from 0.5 to 1.5 μm.

A second object of the present patent Application relates to a general process, useful for growing thin films of metals or semiconductors on amorphous substrates, which consists of the simple deposition of two layers, in succession, on an amorphous layer maintained at a certain temperature.

The so-obtained with films can be used as low-cost crystalline substrates for the epitaxial growth, or quasi-rheotaxial growth of semiconductor material, and can be used hence for the low-cost preparation of such devices as the thin-film solar cells, I.R. detectors and substrates for microelectronic circuits, and still other applications.

Such a process is characterized by:

by means of the flash evaporation technique, or of the sputtering technique where, a first metal or semiconductor is deposited, in the form of an amorphous or microcrystalline layer, on the (a) amorphous support;

on the so-formed layer, by means of the same deposition technique, a second metal or semiconductor is deposited, which has a melting temperature lower than the melting temperature of the first metal or semiconductor, and is capable of forming a homogeneous solid solution with said first metal or semiconductor, by operating at a constant, or substantially constant, temperature, higher than the melting temperature of the second metal or semiconductor, and close to, but lower than the melting temperature of the first metal or semiconductor, so as to cause the first metal or semiconductor to gradually melt and form a liquid alloy with the second metal or semiconductor, and to crystallize in the form of a binary and homogeneous solid alloy, with the (b) binary alloy layer being formed.

A particular aspect of the above-said process relates to the preparation of the above-disclosed electroluminescent device, which can be obtained by means of the following steps:

the deposition, by means of the flash evaporation technique, or of the sputtering technique, of a first metal, in the form of a metal layer having an either amorphous or microcrystalline structure, on an (a) amorphous substrate;

the deposition on the so-formed layer, by means of the same deposition technique, of a second metal, melting at a lower temperature than the first metal, and capable of forming a homogeneous solid solution with the first metal, by operating at a constant, or substantially constant, temperature, higher than the melting temperature of the second metal, and close to, but lower than, the melting temperature of the first metal, so as to cause the first metal to gradually melt and form a liquid alloy with the second metal, and to crystallize in the form of a binary and homogeneous solid alloy, in order to form a (b) binary alloy layer;

the deposition, on the so-formed binary alloy layer, of the luminescent layer, by means of the flash-evaporation technique or of the sputtering technique, of the luminescent layer, and its epitaxial or quasi-rheotaxial growth, in the form of a (c) multicrystal luminescent layer;

the finishing of the device by means of the deposition, in succession, of a (d) insulating layer, and of an (e) conductive layer.

In the preferred form of the practical embodiment, when the (b) layer is formed, two metals are used, whose melting points are different by at least 50° C., and the deposition of the second metal takes place at a temperature lower than the melting temperature of the first metal by not more than 10° C.

The (a) support, useful for the electroluminescent device of the present invention, can be a ceramic support or a glass support, e.g., Corning 7059 glass.

Advantageously, said support is submitted to washing, e.g. with acetone, in an ultrasound tray, before the (b) layer is deposited.

The (b) layer of the electroluminescent device of the present invention is a multicrystal metal layer of a binary alloy of two different metals, having different melting points, and capable of forming a homogeneous solid solution.

The metal couples useful for the intended purpose are those which have solid/liquid phase diagrams of the type as shown in FIGS. 1 and 2 of the drawing table.

More particularly, in FIG. 1 a phase diagram is reported, which relates to compositions of a higher-melting metal (a) with a lower-melting metal (b), wherein the solidification point of such compositions passes through a minimum value.

DESCRIPTION OF THE PREFERRED EMBODIMENTS

The procedure for preparing the binary alloy layer is the following:

A few μm of the (a) metal is deposited on the (a) amorphous substrate, by operating with a temperature of the substrate at which the (a) metal grows in the amorphous, or microcrystalline form. The temperature is then increased up to a value $T_s$ close to, but lower than, the melting temperature $T_a$ of the (a) metal (FIG. 1).. Under these conditions, such an amount of the (b) metal is deposited, that the end composition is a homogeneous solid solution having a composition comprised within the $T_s$–$C_s$ range. When the first layers of the (b) metal are deposited above the (a) metal layer, they interact with the surface of the (a) metal forming a surface liquid alloy having a composition comprised within the $C_L$-X range. Therefore, a concentration gradient is developed between the mass of the (a) metal, and the (A+B) liquid alloy at its surface. This concentration gradient causes the solid to diffuse into the liquid, until the selected concentration comprised within the $T_s$–$C_s$ range is reached. By means of this treatment, most (a) metal will melting and crystallize in the form of a homogeneous solid solution, or binary alloy (A+B).

The dimensions of the crystal grains which are obtained by means of the above disclosed process depend on the amount of (a) metal which is molten and crystallized.

Figure 1:
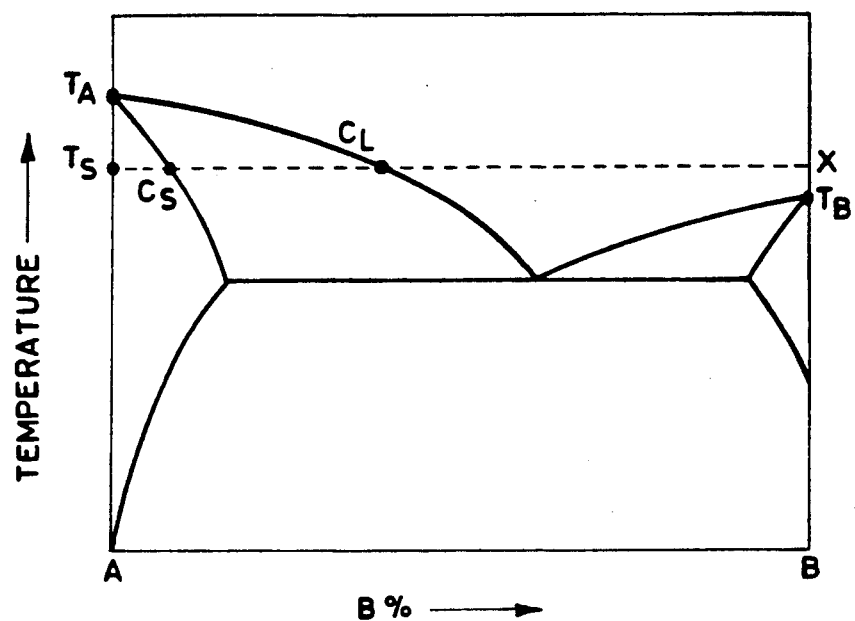

The present Applicant found that the shorter the $C_s$–$C_L$ segment in the phase diagram of FIG. 1—i.e., the closer the operating temperature to the melting point of the (a) metal—, the larger the size of the grains, with the composition of the binary alloy being always comprised within the corresponding $T_s$–$C_s$ range.

By operating under the above-reported conditions, an average side dimension of the grains of the order of 100 $\mu$m can be easily obtained, e.g., in case of lead or aluminum crystallized with a small amount of tin (approximately 7%). By operating at a temperature very close to the melting point of the higher-melting metal, grains can be obtained, for the above disclosed systems, which have side dimensions of up to 0.5 mm.

By operating under similar conditions, the crystallization can be caused in a layer of silver with small amounts of another metal selected from gallium, indium, lead or tin; or in a layer of aluminum, by means of tin; or in a layer of gold, by means of indium or tin; or in a bismuth layer, by means of tin or lead; or in layer of tin, by means of indium.

In all above cases, a (b) binary alloy layer is obtained which is of uniform crystallinity and of multi-crystal nature, with columnar (tabular) grains having the above-indicated dimensions.

Figure 2:
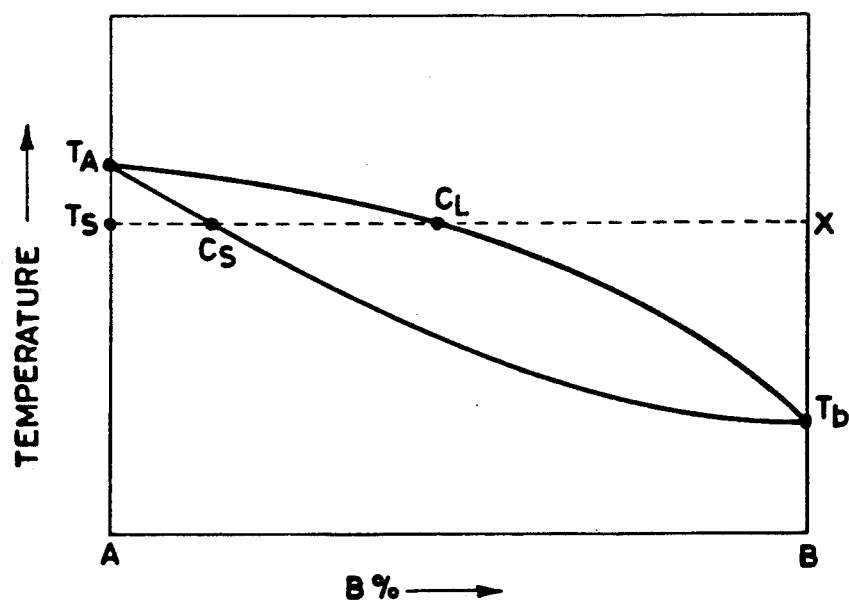

Other metal couples useful in the preparation of the (b) layer are those which show a solid/liquid phase diagram of the type as shown in FIG. 2, wherein the solidification point of the compositions is comprised within the range between the solidification points of the pure components. The symbols reported in FIG. 2 have the same meaning as of those reported in FIG. 1, and the same considerations as previously reported for FIG. 1 are still valid.

Representative, binary alloy couples are, in this case, antimony/bismuth and germanium/silicon.

According to the present invention, the (c) luminescent layer is deposited on the (b) binary alloy layer by means of the flash-evaporation technique or of the sputtering technique, and is made to grow by epitaxial growth at a temperature lower than the melting temperature of the binary alloy layer, or by a growth similar to rheotaxial growth, at a temperature close to the melting temperature of the metal layer, i.e., under conditions of "mobility" of the substrate.

For this purpose, zinc sulphide or zinc selenide doped with an amount of metal manganese ranging from a few parts per thousand parts by weight, up to some parts per one hundred parts by weight, and preferably of the order of 1% by weight, is used.

A (c) luminescent layer is deposited, which has a thickness equal to, or lower than, 2 $\mu$m, and preferably comprised within the range of from 0.5 to 1.5 $\mu$m.

By operating under these conditions, a layer of multicrystal nature, with columnar (tabular) grains and with average side dimensions of the grains of more than 1 $\mu$m, and up to 500 $\mu$m, and normally comprised within the range of from 5 to 50 $\mu$m is formed.

According to the present invention, in order to finish the electroluminescent device, on the (c) luminescent layer an insulating layer (d) and a conductive layer (e) are deposited.

Suitable materials for the (d) layer are those materials which are electrically insulating and optically transparent at the wavelengths of luminescence of the (c) luminescent layer. Examples of such materials are: yttrium oxide ($Y_2O_3$), aluminum oxide ($Al_2O_3$), silicon nitride ($Si_3N_4$), barium titanate ($BaTiO_3$), lead titanate ($PbTiO_3$) and strontium titanate ($SrTiO_3$), which show high values, higher than 100, of the relative dielectric constant. The formation of the (d) layer takes place advantageously by deposition by the flash evaporation technique, or by the sputtering technique, until a thicknesses equal to, or higher than, 0.2 $\mu$m and preferably of the order of 0.3 $\mu$m, is achieved by operating at temperatures lower than the temperatures at which melting phenomena occur, and preferably at room temperatures. The (d) layer is preferably formed by yttrium oxide.

The suitable materials for the (e) layer are advantageously indium oxide ($In_2O_3$); tin oxide ($SnO_2$); ITO; and zinc oxide (ZnO), and are deposited on the (d) layer, by means of the flash evaporation technique or by the sputtering technique, with a thickness of the order of 0.1 $\mu$m, by preferably operating at temperatures close to room temperatures.

The (e) layer is preferably formed by ITO.

The thin-film electroluminescent device according to the present invention shows the advantages derived from the use of amorphous, low-cost (a) supports, and standard deposition techniques, as flash evaporation and sputtering. The (c) luminescent layer of said device consists of crystalline grains which, with the thickness being the same, show side dimensions larger (even 500 times larger) than the grains of the devices known in the prior art, which are based on the use of amorphous supports prepared by means of standard evaporation techniques (flash evaporation and sputtering), or special techniques such as the Atomic Layer Epitaxy.

The high crystalline quality of the (c) layer enables the electroluminescent device of the present invention to reach a higher Lumen/Watt efficiency, and to be fed with peak voltages lower than 100 V.

The following experimental examples are illustrative and non-limitative of the purview of the present invention.

EXAMPLE 1

Glass/Al(Si)/ZnS(Mn)/$Y_2O_3$/ITO Electroluminescent Device

As the substrate, a Corning 7050 glass of 1 square inch of surface area is used. After being washed with acetone in an ultrasound tray, the glass is mounted inside a vacuum chamber inside which a vacuum of approximately $5 \times 10^{-8}$ mbar is made.

On the substrate aluminum is first deposited by means of an electronic gun, at a deposition rate of approximately 50 Å per second, and a substrate temperature of 400°–500° C., until a layer of microcrystalline aluminum of 0.4 $\mu$m of thickness is obtained. When the deposition of aluminum is complete, the temperature of the substrate is increased to approximately 650° C., and by means of the electronic gun, approximately 40 Å of silicon is deposited, which causes the aluminum to crystallize as a solid solution with the silicon. The so-obtained (b) binary alloy layer is of multicrystal nature, with columnar (tabular) grains.

The so-obtained crystallized aluminum substrate is transferred into a sputtering system, wherein three targets, respectively of zinc sulphide doped with 1% by weight of metal manganese; yttrium oxide ($Y_2O_3$); and ITO, are mounted.

More particularly, the temperature of the substrate is first increased to approximately 500° C., and on the substrate a layer of approximately 0.6 μm of ZnS(Mn) is deposited, at a deposition rate of approximately 0.5 Å per second.

The layer of ZnS(Mn) grows on the crystallized layer of aluminum by epitaxy, generating a multicrystal layer with columnar (tabular) grains and with average side dimensions of the order of 50 μm.

Without interrupting the vacuum, a layer of $Y_2O_3$ (0.3 μm) and a layer of ITO (0.1 μm) are subsequently deposited at a temperature of the substrate close to room temperature.

EXAMPLE 2

Glass/Pb(Sn)/ZnS(Mn)/ $Y_2O_3$/ITO Electroluminescent Device

A substrate is used, which is identical to the substrate of Example 1. After being washed according to the same procedure as disclosed in Example 1, the substrate is mounted inside a vacuum chamber wherein two crucibles, respectively containing lead and tin, are mounted.

The substrate is then heated to a temperature of approximately 100° C., and on it approximately 4 μm of lead are deposited by flash evaporation, at a deposition rate of approximately 50 Å per second. In this way, a layer of microcrystalline lead is obtained. The temperature of microcrystalline lead is obtained. The temperature of the substrate is then increased to approximately 310° C., and 100-2000 Å of antimony are deposited, which causes the lead to crystallize as a solid solution with the antimony, with and a multicrystal structure with columnar (tabular) grains to form.

The so obtained crystalline lead substrate is charged to a sputtering system containing the three targets of ZnS(Mn); $Y_2O_3$; and ITO, as in Example 1.

More particularly, the substrate is first heated to a temperature of approximately 310° C., and on it approximately 0.6 μm of ZnS(Mn) are deposited as in Example 1. In this case, the layer of ZnS(Mn) grows with a quasi-rheotaxial growth mechanism, in that the substrate is maintained at a temperature close to the melting temperature of the substrate, generating a multicrystal layer with columnar (tabular) grains having average side dimensions of the order of 50 μm.

Without interrupting the vacuum, a layer of $Y_2O_3$ (0.3 μm) and a layer of ITO (0.1 μm) are subsequently deposited by operating at a temperature of the substrate close to room temperatures.

EXAMPLES 3-7

The processes are carried out by operating in a way similar to Examples 1 and 2, and the following electroluminescent devices are produced:

Glass/Al (Si)/ZnS (Mn)/$Al_2O_3$/ITO;
Glass/Al (Si)/ZnS (Mn)/$SrTiO_3$/ITO;
Glass/Al (Ge)/ZnS (Mn)/$Y_2O_3$/ITO;
Glass/Al (Ge)/ZnS (Mn)/$Y_2O_3$/ITO; and
Glass/Bi (Sn)/ZnS (Mn)/$Y_2O_3$/ITO.

We claim:

1. A thin film electroluminescent device, having good electro-optical characteristics and a threshold voltage for luminescence lower than about 100 volts, wherein said device comprises:
   (a) an amorphous support;
   (b) a binary alloy layer deposited on said amorphous support;
   (c) a luminescent layer deposited on said binary alloy layer;
   (d) an insulating layer deposited on said luminescent layer; and
   (e) a conductive layer deposited on said insulating layer;
   wherein said binary alloy layer further comprises:
   two different metals or a metal and a semiconductor wherein said two different metals or said metal and said semiconductor have melting points different from one another and wherein said two different metals or said metal and said semiconductor are capable of forming a homogeneous solid solution having a multicrystal structure, wherein said multicrystal structure has columnar grains, and wherein the length and width of said columnar grains are not less than about 1 μm and not greater than about 500 μm and the depth of said columnar grains is not less than about 0.2 μm; and wherein said luminescent layer comprises:
   a layer of zinc sulfide or zinc selenite wherein said zinc sulfide or zinc selenite layer comprises manganese and has a multicrystal structure, wherein said multicrystal structure has columnar grains are not less than about 1 μm and not greater than about 500 μm and the depth of said columnar grain is not greater than about 2 μm.

2. The device of claim 1 wherein said amorphous support comprises a glass support or a ceramic support.

3. The device of claim 1 wherein said binary alloy of said binary alloy layer is selected from the group consisting of lead, tin, bismuth, antimony, aluminum, gallium, silicon, silver, indium, and gold.

4. The device of claim 1 wherein said two different metals or said metal and said semiconductor of said binary alloy of said binary alloy layer comprise aluminum and silicon, lead and tin, aluminum and germanium, aluminum and gallium, and bismuth and tin.

5. The device of claim 1 wherein the length and width of said grains of said binary alloy layer comprise the range of from about 10 μm to about 100 μm and a depth in the range of from about 0.5 μm about 2 μm.

6. The device of claim 1 wherein said manganese of said luminescent layer comprises 1% by weight and wherein said grains of said luminescent layer have a length and width comprising the range of from about 5 μm to about 50 μm and a depth in the range of from about 0.5 μm to about 1.5 μm.

7. The device of claim 1 wherein said insulating layer comprises a layer of yttrium oxide ($Y_2O_3$), aluminum oxide ($Al_2O_3$), silicon nitride ($Si_3N_4$), barium titanate ($BaTiO_3$), lead titanate ($PbTiO_3$), and strontium titanate ($SrTiO_3$), and wherein said layer comprises a depth of not less than about 0.2 μm.

8. The device of claim 7 wherein said insulating layer is a layer of yttrium oxide ($Y_2O_3$) having a depth of about 0.3 μm.

9. The device of claim 1 wherein said conductive layer comprises a layer of indium oxide ($In_2O_3$), tin oxide ($SnO_3$), ITO, or zinc oxide (ZnO), and wherein said layer has a depth of about 0.1 μm.

* * * * *